(12) United States Patent
Inoue et al.

(10) Patent No.: US 6,663,741 B1
(45) Date of Patent: Dec. 16, 2003

(54) ADHESIVE TAPE FOR TEMPORARY-ATTACHMENT OF GREEN SHEETS FOR CERAMIC ELECTRONIC DEVICES AND METHOD FOR PRODUCING CERAMIC ELECTRONIC DEVICES

(75) Inventors: Eiji Inoue, Yamatokooriyama (JP); Toshiaki Kasazaki, Yamatokooriyama (JP); Shinichiro Kawahara, Yamatokooriyama (JP); Masayoshi Yamamoto, Yamatokooriyama (JP); Kiyotaka Nagai, Yamatokooriyama (JP)

(73) Assignee: Nitta Corporation, Osaka (JP)

( * ) Notice: Subject to any disclaimer, the term of this patent is extended or adjusted under 35 U.S.C. 154(b) by 218 days.

(21) Appl. No.: 10/009,969

(22) PCT Filed: Jun. 9, 2000

(86) PCT No.: PCT/JP00/03795
§ 371 (c)(1),
(2), (4) Date: Dec. 10, 2001

(87) PCT Pub. No.: WO00/77112
PCT Pub. Date: Dec. 21, 2000

(30) Foreign Application Priority Data

Jun. 10, 1999 (JP) ............................................ 11/164508

(51) Int. Cl.$^7$ .............................. B32B 31/18; C09J 7/02
(52) U.S. Cl. ................. 156/248; 156/268; 428/355 AC
(58) Field of Search .................................. 156/247, 248, 156/268; 428/343, 355 AC

(56) References Cited

U.S. PATENT DOCUMENTS 616,520 A * 12/1898 Kawahara et al. ............. 493/75

FOREIGN PATENT DOCUMENTS

| JP | 8-188759 | * | 7/1996 |
| JP | 09208924 A | | 8/1997 |
| JP | 09251272 A | | 9/1997 |
| JP | 09251273 A | | 9/1997 |
| JP | 09251923 A | | 9/1997 |
| JP | 9-279102 | * | 10/1997 |
| WO | WO 90/13420 | | 11/1990 |
| WO | WO 92/13901 | | 8/1992 |

* cited by examiner

Primary Examiner—Curtis Mayes
(74) Attorney, Agent, or Firm—Snell & Wilmer, LLP

(57) ABSTRACT

An adhesive tape for temporary attachment of green sheets for a ceramic electronic device includes a substrate film and an adhesive layer provided on at least one face of the substrate film. The adhesive layer is composed of an adhesive composition, the adhesive composition containing a side-chain crystallizable polymer, wherein the side-chain crystallizable polymer contains as a component an acrylic acid alkyl ester and/or a methacrylic acid alkyl ester which has a straight-chain alkyl group including 16 or more carbon atoms as a side chain, the side-chain crystallizable polymer having a first-order melting transition occurring in a temperature range narrower than about 35° C., and wherein the adhesive layer has a modulus of elasticity of about $5 \times 10^4$ Pa to about $1 \times 10^8$ Pa. An adhesive tape for temporary attachment of green sheets for ceramic electronic devices can be provided such that a large adhesion strength is obtained when temporarily attaching a laminate of green sheets, and that when a work is to be removed, peeling can easily occur without contaminating the work.

4 Claims, 1 Drawing Sheet

ADHESIVE TAPE FOR TEMPORARY-ATTACHMENT OF GREEN SHEETS FOR CERAMIC ELECTRONIC DEVICES AND METHOD FOR PRODUCING CERAMIC ELECTRONIC DEVICES

TECHNICAL FIELD

The present invention relates to an adhesive tape for temporary attachment, used during the production of ceramic electronic devices, e.g., multilayer ceramic capacitors, multilayer ceramic inductors, resistors, ferrites, sensor elements, thermistors, varistors, or piezoelectric ceramics, and in particular for use in a step of cutting a green (i.e., unprocessed) sheet of ceramic into a number of chips.

BACKGROUND ART

For example, a multilayer ceramic capacitor, as one example of a ceramic electronic device, may be produced in the following manner.

A slurry of ceramic powder is thinly spread out with a doctor blade to make a ceramic green sheet. After a plurality of electrodes are printed on the surface of the green sheet, a number of such green sheets are laminated and integrated so as to form a green sheet laminate. Next, after the laminate is initially heat-pressed, the laminate is cut in longitudinal and transverse directions with a cutting tool such as a dicer or a guillotine blade to obtain a number of ceramic laminate chips. These chips (also referred to as "works") are then sintered, and external electrodes are formed on end faces of the resultant works. Thus, a multilayer ceramic capacitor can be obtained.

In the aforementioned step of obtaining an integrated laminate and the step of cutting the laminate into green chips, a green sheet is temporarily fixed on a base for sheet stabilization by using an adhesive tape, and after the cutting, the works are peeled off the adhesive tape on the surface of the base.

As electronic apparatuses become downsized, the capacitance per unit volume of multilayer ceramic capacitors (which are electronic devices) must be increased. This has resulted in a trend for using increased numbers of laminated green sheets and harder ceramic materials. As a result, problems have emerged which were not associated with traditional green sheet cutting.

FIG. 1 illustrates a situation in which a laminate 3 is adhered to an adhesive tape 1 which is composed of a substrate film 6 and an adhesive layer 2 provided on the surface of the substrate film 6, the laminate 3 being about to be cut with a cutting blade. The adhesive tape 1 is affixed on a base 7. Electrodes 5 are buried at positions within the laminate 3 which shall define central portions, along a width direction, of the resultant chips.

For example, when the laminate 3 having a certain thickness is cut in predetermined sizes, cutting the laminate 3 along a cutting line X (solid line) in the figure causes the laminate 3 to be shifted along a lateral direction due to the pressure applied by the cutting blade, so that the broken section of the laminate 3 appears over at a transposed line Y. Thus, when a cross-section of the resultant chip 8 is observed after the cutting, the position of the electrode 5 within the chip 8 may be eccentric along the chip width direction, as shown in FIG. 2. This causes the following problems:

① The eccentricity of electrode positions after the formation of the chips causes a degree of deviation in the distance between the electrode and an outer wall of each chip, this distance being a design factor required for each specific product. The distance (margin) m between the outer wall 8a and the electrode 5 greatly influences the puncture endurance of a capacitor. When there is eccentricity in the electrode positions, an interlayer destruction (referred to as a "chip crack") may occur on the wall which is subjected to a reduced margin. This may cause malfunctioning of a ceramic capacitor.

② Similarly, if the eccentricity of an electrode position within a chip exceeds the specified design tolerance, such a chip is considered as unacceptable, resulting in a decrease in the product yield.

The aforementioned phenomenon is presumably a result of a deformation stress applied at the time of inserting the cutting blade, which in turn is ascribable to the change in the material of green sheets.

Furthermore, when peeling the chips off the surface of an adhesive tape, it is necessary to reduce the adhesion strength between the chips and the adhesive tape. If the adhesion strength cannot be adequately reduced, the following problems may occur.

(1) Since the laminate itself has not been sintered yet, the adhesion between the respective layers may be insufficient. Therefore, when the chips are peeled off the surface of the adhesive tape, interlayer peeling may occur within the laminate due to an excessively strong adhesion strength of the adhesive tape.

(2) Even if interlayer peeling does not occur, the adhesive layer may be left as a contaminant on the bottom of a chip. As a result, when the chips are sent to a subsequent process, the contaminant may cause blocking. As the residue of the contaminant is also subjected to sintering, voids or cracks may occur due to the sintering of an organic material.

Thus, the reliability and the yield of the product are unfavorably affected.

In order to reduce the adhesion strength at the time of peeling the works, Japanese Publication for Opposition No. 6-79812 discloses an adhesive tape which includes an adhesive layer of a thermal foaming type, for example. A foaming agent is contained in the adhesive layer of this adhesive tape. As a result, by heating the adhesive tape after the cutting of a laminate, the foaming agent acts to reduce the area of contact between the adhesive tape and the works, so that the works can be easily peeled off the adhesive tape surface.

However, since the adhesive tape has a high foaming temperature, there are problems in that a binder within the laminate may evaporate to contaminate the works at the time of heating the adhesive tape, or that the laminate may fail to attain a predetermined hardness due to the evaporation of the binder prior to a preliminary sintering. Moreover, the adhesion strength may not be adequately reduced due to non-uniform foaming, so that the works may not be able to be peeled off the adhesive tape.

The temperature at which cutting is performed for an adhered green sheet is generally in the range of about 60° C. to about 100° C. However, the thermal foaming type adhesive sheet may begin a degree of foaming in a relatively high region (90° C. or above) of this temperature range, so that the adhesive sheet may occasionally lose its adhesion strength. This may make it impossible to the affix the green sheet during the cutting process.

Needless to say, the aforementioned problem of eccentricity of the electrode positions within the green sheet associated with the cutting of green sheets has not been overcome.

DISCLOSURE OF THE INVENTION

An adhesive tape for temporary attachment of green sheets for a ceramic electronic device according to the present invention comprises a substrate film and an adhesive layer provided on at least one face of the substrate film, the adhesive layer comprising an adhesive composition, the adhesive composition containing a side-chain crystallizable polymer, wherein the side-chain crystallizable polymer comprises as a component an acrylic acid alkyl ester and/or a methacrylic acid alkyl ester which has a straight-chain alkyl group including 16 or more carbon atoms as a side chain, the side-chain crystallizable polymer having a first-order melting transition occurring in a temperature range narrower than about 35° C., and wherein the adhesive layer has a modulus of elasticity of about $5 \times 10^4$ Pa to about $1 \times 10^8$ Pa.

In one embodiment, the side-chain crystallizable polymer is obtained from a monomer mixture comprising: about 40 to about 70 wt. % of an acrylic acid alkyl ester and/or a methacrylic acid alkyl ester which has an alkyl group including 1 to 6 carbon atoms; about 2 to about 10 wt. % of a carboxyl group-containing ethylenic unsaturated monomer; and about 20 to about 60 wt. % of an acrylic acid alkyl ester and/or a methacrylic acid alkyl ester which has an alkyl group including 16 to 22 carbon atoms.

A method for producing a ceramic electronic device according to the present invention comprises the steps of: allowing a green sheet laminate of ceramics to adhere to a base via an adhesive tape, and thereafter cutting the laminate into chips; and peeling the chips off a surface of the base while cooling the adhesive tape, wherein the adhesive tape comprises a substrate film and an adhesive layer provided on at least one face of the substrate film, the adhesive layer comprising an adhesive composition, the adhesive composition containing a side-chain crystallizable polymer, wherein the side-chain crystallizable polymer comprises as a component an acrylic acid ester and/or a methacrylic acid ester which has a straight-chain alkyl group including 16 or more carbon atoms as a side chain, the side-chain crystallizable polymer having a first-order melting transition occurring in a temperature range narrower than about 35° C., and wherein the adhesive layer has a modulus of elasticity of about $5 \times 10^4$ Pa to about $1 \times 10^8$ Pa.

In one embodiment, the ceramic electronic device is a ceramic capacitor.

After a laminate which is obtained by laminating ceramic green sheets with electrodes printed thereon is heated, the laminate is affixed to a base via an adhesive tape, and thereafter the laminate is cut. Since the adhesive tape provides excellent tackiness, the laminate cannot be peeled at this time. When the works are removed from the adhesive tape after the laminate is cut, the adhesive tape is spontaneously cooled or forcibly cooled to a predetermined temperature or below so that the works can be easily peeled off the adhesive tape.

Since the adhesive layer has a modulus of elasticity of about $5 \times 10^4$ Pa to about $1 \times 10^8$ Pa, the lateral deformation stress, which is applied owing to the physical thickness of a cutting blade as it is inserted, can be cancelled or reduced by the elastic properties of the adhesive layer, thereby subduing the occurrence of shifts in the electrode positions.

As used herein, "green sheets for ceramic electronic devices" encompass both green sheets and green sheet laminates composed essentially of ceramics, which are used during the production of ceramic electronic devices, e.g., multilayer ceramic capacitors, multilayer ceramic inductors, resistors, ferrites, sensor elements, thermistors, varistors, or piezoelectric ceramics.

According to the present invention, the tackiness of an adhesive tape for temporary attachment with respect to a laminate of green sheets of ceramics can be controlled simply by changing the temperature of the adhesive tape. Thus, a large adhesion strength can be obtained when temporarily attaching the laminate; when a work is to be removed, peeling can easily occur simply by cooling. Since the works will not be contaminated, it is possible to enhance the reliability of ceramic electronic devices such as multi-layer capacitors.

Moreover, it is possible to attain cutting precision of chips (equalization of margins), thereby improving the reliability and yield of the products.

BEST MODES FOR CARRYING OUT THE INVENTION

Substrate Film

Figure 1:
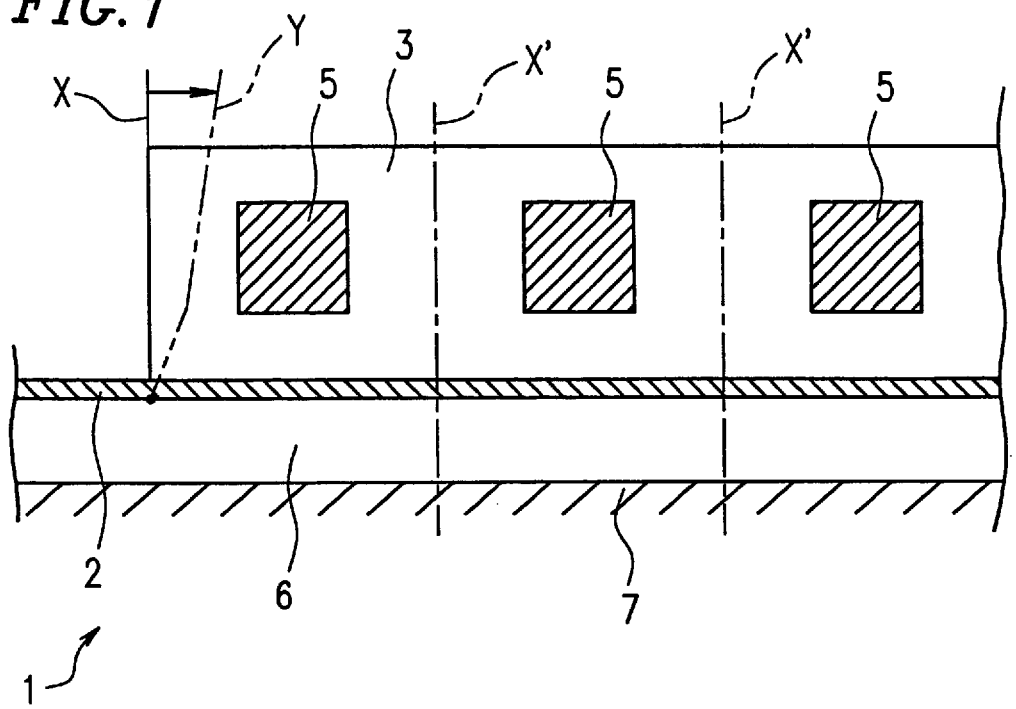
FIG. 1 is a diagram illustrating a situation in which a laminate is adhered to an adhesive tape which is composed of a substrate film and an adhesive layer provided on the surface of the substrate film, the laminate being about to be cut with a cutting blade.
Figure 2:
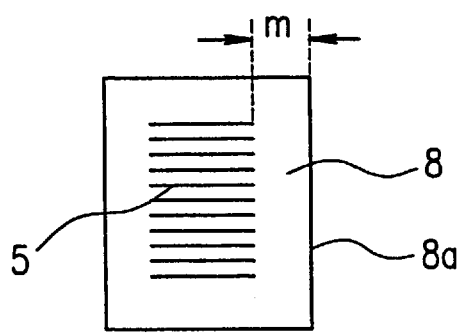
FIG. 2 is a schematic diagram showing the position of an electrode within a chip.

Examples of substrate films which can be used for the adhesive tape for temporary attachment according to the present invention include sheets composed of a single layer or multiple layers of a synthetic resin film having a thickness of about 5 to about 500 μm, e.g., polyethylene, polypropylene, polyester, polyamide, polyimide, polycarbonate, ethylene-vinyl acetate copolymer, ethylene-ethyl acrylate copolymer, ethylene-polypropylene copolymer, polyvinyl chloride.

In order to enhance the adhesion with the adhesive layer, the surface of the substrate film may be subjected to a corona discharge treatment, a plasma treatment, a blast treatment, a chemical etching treatment, a primer treatment, or the like.

On at least one face of such a substrate film, an adhesive layer composed of an adhesive composition as described below is laminated.

Side-chain Crystallizable Polymer

A side-chain crystallizable polymer to be contained in the adhesive composition has a melting point which occurs within a temperature range narrower than about 35° C. (also referred to as "first-order melting transition"). Preferably, those which have a melting point occurring within a temperature range narrower than about 25° C. are used.

The side-chain crystallizable polymer is present within the adhesive composition in an amount which is sufficient to exhibit characteristics such that the adhesive layer composed of the adhesive composition becomes substantially non-tacky at temperatures equal to or below a predetermined temperature while showing tackiness at higher temperatures.

However, the predetermined temperature may be changed depending on the temperature used at the time when a laminate of ceramic green sheets is cut, etc. For example, substantial non-tackiness may be exhibited at temperatures equal to or below 20° C. while exhibiting tackiness at higher temperatures; substantial non-tackiness may be exhibited at temperatures equal to or below 30° C. while exhibiting tackiness at higher temperatures; or substantial non-tackiness may be exhibited at temperatures equal to or below 40° C. while exhibiting tackiness at higher temperatures. Such changes in the predetermined temperature can be made by altering the polymer structure, the prescription for the adhesive composition, or the like.

As used herein, the term "melting point" or "first-order melting transition" means the temperature at which an equilibrium process causes certain portions of a polymer, initially aligned in an ordered array, to become disordered. As used herein, the term "freezing point" means the temperature at which an equilibrium process causes the certain portions of the polymer, initially in a disordered state, to become aligned in an ordered array.

In one embodiment, the first-order melting transition temperature or melting point of the polymer is preferably in the range of about 0° C. to about 70° C., and more preferably in the range of about 15° C. to about 55° C.

It is preferable that the melting occur rapidly, i.e., over a relatively narrow temperature range which is less than about 35° C., and preferably less than about 25° C.

The adhesive composition includes a polymer which loses its tackiness by using a simple cooling method, e.g., by the use of ice, ice bags, cool air, refrigerants, or the like.

In another embodiment, the polymer has a freezing (i.e., "crystallizing") point in the range of about −20° C. to about 50° C., and more preferably in the range of about −5° C., to about 40° C. It is also preferable that the polymer crystallizes rapidly. To this end, seeding agents, or crystallization catalysts can be incorporated into the polymer which provides rapid crystallization kinetics. In this embodiment, it becomes very easy to peel the adhesive layer off a ceramic electronic device. After use, the adhesive layer can be easily peeled, without leaving unwanted scars on the surface of the ceramic electronic device, by simply cooling the adhesive layer to a temperature which is slightly lower than the use temperature.

The polymer is preferably a crystallizable polymer having a weight average molecular weight of preferably about 20,000 to about 2,300,000 Da, typically about 100,000 to about 1,300,000 Da, and most typically about 250,000 to about 1,000,000 Da.

The side-chain crystallizable polymer contained in the adhesive composition includes as a component thereof an acrylic acid ester and/or methacrylic acid ester which has a straight-chain alkyl group including 16 or more carbon atoms as a side chain.

Preferably, the side-chain crystallizable polymer is obtained by a monomer mixture containing about 40 to about 70 wt. % of an acrylic acid alkyl ester and/or a methacrylic acid alkyl ester which has an alkyl group including 1 to 6 carbon atoms, about 2 to about 10 wt. % of a carboxyl group-containing ethylenic unsaturated monomer, and about 20 to about 60 wt. % of an acrylic acid alkyl ester and/or a methacrylic acid alkyl ester which has an alkyl group including 16 to 22 carbon atoms.

As an acrylic acid ester and/or a methacrylic acid ester (hereinafter also referred to as "(meth)acrylate") which has a straight-chain alkyl group including 16 or more carbon atoms as a side chain, a (meth)acrylate which has a straight-chain alkyl group including 16 to 22 carbon atoms may be preferably used, e.g., hexadecyl(meth)acrylate, stearyl (meth)acrylate, or dococyl (meth)acrylate.

Furthermore, a (meth)acrylate which has a straight-chain alkyl group including 16 to 30 carbon atoms, e.g., triaconta (meth)acrylate, may also be used.

Examples of (meth)acrylates which have a straight-chain alkyl group including 1 to 6 carbon atoms include methyl (meth)acrylate, ethyl(meth)acrylate, butyl(meth)acrylate, isobutyl(meth)acrylate, tertiary-butyl(meth)acrylate, hexyl (meth)acrylate, cyclohexyl(meth)acrylate, and isoamyl (meth)acrylate.

As carboxyl group-containing ethylenic unsaturated monomer, acrylic acid, methacrylic acid, crotonic acid, itaconic acid, maleic acid, fumaric acid, or the like may be used, with acrylic acid being particularly preferable.

The adhesive composition used in the present invention may additionally contain any components such as plasticizers, tackifiers, fillers, and the like. Examples of tackifiers include special rosin ester type tackifiers, terpene phenol type tackifiers, petroleum resin type tackifiers, high hydroxyl value rosin ester type tackifiers, hydrogenated rosin ester type tackifiers, and the like.

In order to provide a temperature-active adhesive composition on a substrate film, a knife coater, a roll coater, a calender coater, a comma coater, or the like is often used in general. Depending on the thickness of the coating and the viscosity of the material, a gravure coater or a rod coater may be used. The adhesive composition may be applied by being transferred from a release sheet, as in the manner of transfer printing. The composition may be applied neat (i.e., without anything else), or in a suitable solvent, or as an emulsion or latex.

The adhesive layer used in the present invention has a modulus of elasticity in the range of about $5 \times 10^4$ Pa to about $1 \times 10^8$ Pa, and preferably about $1 \times 10^5$ Pa to about $1 \times 10^7$ Pa.

If the modulus of elasticity of the adhesive layer is smaller than about $5 \times 10^4$ Pa, the effect of subduing the occurrence of shifts in the positions of electrodes buried in a green sheet at the time of cutting the green sheet with a cutting blade becomes small. If the modulus of elasticity of the adhesive layer exceeds about $1 \times 10^8$ Pa, the tackiness of the adhesive layer tends to decrease.

A polymer having such properties can be obtained by polymerizing a monomer mixture containing the following components, for example: about 2 to about 10 wt. % (in particular about 3 to about 6 wt. %) of a carboxyl group-containing ethylenic unsaturated monomer, about 40 to about 70 wt. % of a (meth)acrylate which has a straight-chain alkyl group including 1 to 6 carbon atoms, and about 20 to about 60 wt. % of a (meth)acrylate which has a straight-chain alkyl group including 16 to 22 carbon atoms.

Preferable examples of crystallizable polymers contained in the adhesive composition include the following:

(1) a copolymer of 20 to 50 parts by weight of hexadecyl acrylate, 40 to 70 parts by weight of methylacrylate, and 2 to 10 parts by weight of acrylic acid;

(2) a copolymer of 20 to 50 parts by weight of stearyl acrylate, 40 to 70 parts by weight of methylacrylate, and 2 to 10 parts by weight of acrylic acid; and (3) a copolymer of 20 to 50 parts by weight of dococyl acrylate, 40 to 70 parts by weight of methylacrylate, and 2 to 10 parts by weight of acrylic acid.

In terms of prevention of contamination during storage or commercial distribution, it is preferable to adhesion-protect the adhesive layer with a separator until the adhesive layer is adhered to the surface of a green sheet laminate. The separator can be made of paper, a plastic film such as a polypropylene film or a polyester film, or a thin flexible leaf of metal foil or the like. The separator is subjected to a surface treatment with a release agent as necessary so as to be rendered easy to peel.

Next, a method for producing a ceramic multilayer capacitor as a ceramic electronic device will be described.

First, a slurry of ceramic powder is thinly spread out with a doctor blade to make a ceramic green sheet, and electrodes are printed on the surface of the green sheet. A number of such green sheets are laminated and integrated so as to form a green sheet laminate. Next, the laminate is heated, and affixed on a base via the adhesive tape according to the present invention. Since the temperature at this time is relatively high (e.g., about 30° C. to about 100° C.), the laminate adheres well to the adhesive layer of the adhesive tape. The adhesive tape according to the present invention can be used at about 150° C. or below, and causes no problems even when it is used in a higher temperature region of about 80° C. to about 120° C.

Next, the laminate is heat-pressed and cut. At the time of cutting, the adhesive layer of the adhesive tape prevents the green sheet from traveling in a lateral direction when being pressed by a cutting blade. After a number of ceramic laminate chips are formed in this manner, the resultant works are removed from the adhesive tape. Thereafter, the works are subjected to a preliminary sintering process, and a sintering process.

When the work is to be peeled off the adhesive tape, the adhesive tape is cooled below a predetermined temperature adhesive tape, whereby the work can be easily peeled off the adhesive tape.

When the adhesive tape is to be cooled, it can be cooled via the base (i.e., by employing a structure through which a temperature-controlled medium such as cold water is passed, a Peltier device structure, etc.). Alternatively, the laminate may be placed in a refrigerator, a freezer, or the like, or cool air may be blown over the laminate.

In some cases, the works can be peeled by spontaneous cooling if the cycle time allows.

Thereafter, the works are sintered, and external electrodes are formed on end faces of the works, whereby chip-type ceramic electronic devices are obtained.

Although the above-described adhesive tape is constructed by providing an adhesive layer on one face of a substrate film, it is also applicable to provide an adhesive layer on the other face of the substrate film, so that the adhesive tape may be utilized as a double-sided adhesive tape. In this case, as the second adhesive layer which is laminated on the other face of the substrate film, (1) a commercially available pressure-sensitive adhesive: (2) an adhesive which is composed of a mixture of a commercially available pressure-sensitive adhesive and the adhesive composition used in the present invention (of the type whose adhesion decreases with cooling); or (3) an adhesive which is composed of the adhesive composition used in the present invention may be used.

Examples of such pressure-sensitive adhesives include: natural rubber adhesives; synthetic rubber adhesives; styrene/butadiene latex-base adhesives; block copolymer type thermoplastic rubbers; butyl rubbers; polyisobutylene; acrylic adhesives; and vinyl ether copolymers.

Although multilayer ceramic capacitors are illustrated above as ceramic electronic devices, the present invention is not limited thereto. The present invention is applicable to, for example, an adhesive tape for temporary attachment which is to be used in a step of cutting green sheets for ceramic electronic devices into a number of chips during the production of fine ceramic devices such as IC circuit boards, ferrites, sensor elements, or varistors.

EXAMPLES

Hereinafter, the present invention will be specifically described by way of illustrative examples. In the following description, any reference to "part(s)" means "part(s) by weight".

A. Preparation of Polymer

Synthesis Example 1

First, 65 parts of dococyl acrylate, 30 parts of methyl acrylate, 5 parts of acrylic acid, and 0.3 parts of Trigonox 23-C70 (Kayaku Akzo K.K.) were mixed in 230 parts of ethyl acetate/heptane (7:3). The mixture was stirred at 55° C. for 5 hours to polymerize these monomers. The resultant polymer had a weight average molecular weight of about 600,000, and a melting point of 60° C.

Synthesis Example 2

First, 55 parts of dococyl acrylate, 40 parts of methyl acrylate, 5 parts of acrylic acid, and 0.3 parts of Trigonox 23-C70 (Kayaku Akzo K.K.) were mixed. The mixture was stirred at 55° C. for 5 hours to polymerize these monomers. The resultant polymer had a weight average molecular weight of about 600,000, and a melting point of 56° C.

Synthesis Example 3

First, 45 parts of dococyl acrylate, 50 parts of methyl acrylate, 5 parts of acrylic acid, and 0.3 parts of Trigonox 23-C70 (Kayaku Akzo K.K.) were mixed. The mixture was stirred at 55° C. for 5 hours to polymerize these monomers. The resultant polymer had a weight average molecular weight of about 660,000, and a melting point of 54° C.

Synthesis Example 4

First, 35 parts of dococyl acrylate, 60 parts of methyl acrylate, 5 parts of acrylic acid, and 0.3 parts of Trigonox 23-C70 (Kayaku Akzo K.K.) were mixed. The mixture was stirred at 55° C. for 5 hours to polymerize these monomers. The resultant polymer had a weight average molecular weight of about 600,000, and a melting point of 46° C.

Synthesis Example 5

First, 92 parts of stearyl acrylate, 5 parts of hexadecyl acrylate, 3 parts of acrylic acid, and 1 part of Kayaester HP-70 (Kayaku Akzo K.K.) were mixed. The mixture was stirred at 55° C. for 5 hours to polymerize these monomers. The resultant polymer had a weight average molecular weight of about 630,000, and a melting point of 50° C.

B. Preparation of an Adhesive Tape for Temporary Attachment of Green Sheets for Ceramic Electronic Devices

Example 1

From the polymer obtained according to Synthesis Example 2 above, a polymer solution was prepared by using a solvent (ethyl acetate) so that the solid portion in the polymer solution accounted for 30% by weight. To this polymer solution, Kemitaito PZ-33 (manufactured by NIPPON SHOKUBAI Co., Ltd.) was added as a cross-linking agent, so that 0.2 parts of Kemitaito PZ-33 was present for 100 parts of the polymer. Then, the polymer solution was applied by using a roll coater on a surface of a PET film (about 100 μm) which had been subjected to a corona discharge treatment. Thus, an adhesive tape for temporary attachment with a release sheet, having an acrylic-type adhesive layer (thickness: about 50 μm) was obtained.

The adhesion strength of the resultant adhesive tape was measured with respect to SUS, according to JIS C2107.

Moreover, after the adhesive tape was peeled off a SUS surface at a predetermined temperature, the level of contamination on the SUS surface was measured by TDS (Thermal Desorption Spectroscopy) techniques. The results are shown in Table 1.

The measurements of modulus of elasticity were taken by the following method:
MEASUREMENT DEVICE: Carri-Med CSL-10 Stress-controlled rheometer, manufactured by TA INSTRUMENTS
MEASUREMENT CONDITIONS:
  geometry: flat plate (made of SUS) having a diameter of 20 mm
  measurement method: oscillation measurement method
  angular displacement: 5 milliradians
  frequency: 1 Hz
  measurement temperature and the like:

The storage modulus of elasticity (G') measured during a period of decreasing temperature in the up-down temperature steps of 50° C., 100° C., and 50° C. (rate of temperature change: 2° C./min.) was deemed as the "modulus of elasticity". According to the present invention, the G' value at 80° C. was adopted.

Comparative Example 2

An adhesive tape was obtained in a manner similar to Example 1 except that the polymer obtained according to Synthesis Example 5 was used. The adhesion strength and contaminating properties of the resultant adhesive tape were evaluated in a manner similar to Example 1. These results are shown in Tables 1 and 2.

Comparative Example 3

With respect to a thermal foaming type adhesive sheet (Foaming release sheet (3194MS), manufactured by Nitto Denko Corporation), the adhesion strength and contaminating properties were evaluated in a manner similar to Example 1. These results are shown in Tables 1 and 2.

TABLE 1

| | peeling force (g/ 25 mm) | | | | | | | residue |
|---|---|---|---|---|---|---|---|---|
| | 20° C. | 30° C. | 40° C. | 50° C. | 60° C. | 80° C. | 100° C. | after peel |
| Ex. 1 | 0 | 0 | 0 | 0 | 350 | 250 | 200 | No (after peel at 25° C.) |
| Ex. 2 | 0 | 0 | 0 | 0 | 550 | 400 | 300 | No (after peel at 25° C.) |
| Ex. 3 | 0 | 0 | 0 | 700 | 750 | 550 | 400 | No (after peel at 25° C.) |
| Ex. 1 | 0 | 0 | 0 | 0 | 300 | 150 | 70 | No (after peel at 25° C.) |
| Ex. 2 | 0 | 0 | 0 | 0 | 200 | 50 | 30 | No (after peel at 25° C.) |
| Ex. 3 | 100 | 100 | 120 | 120 | 140 | 130 | 0 | Yes (after peel at 25° C.) |

The results are shown in Table 2. In Table 2, "○" represents an excellent product; "Δ" represents an acceptable product; and "X" represents an unacceptable product.

Example 2

An adhesive tape was obtained in a manner similar to Example 1 except that the polymer obtained according to Synthesis Example 3 was used. The adhesion strength and contaminating properties of the resultant adhesive tape were evaluated in a manner similar to Example 1. These results are shown in Tables 1 and 2.

Example 3

An adhesive tape was obtained in a manner similar to Example 1 except that the polymer obtained according to Synthesis Example 4 was used. The adhesion strength and contaminating properties of the resultant adhesive tape were evaluated in a manner similar to Example 1. These results are shown in Tables 1 and 2.

Comparative Example 1

An adhesive tape was obtained in a manner similar to Example 1 except that the polymer obtained according to Synthesis Example 1 was used. The adhesion strength and contaminating properties of the resultant adhesive tape were evaluated in a manner similar to Example 1. These results are shown in Tables 1 and 2.

TABLE 2

| | polymer blend | adhesion start temperature | modulus of elasticity | judgment of electrode position |
|---|---|---|---|---|
| Ex.1 | C22A/C1A/AA 55/40/5 | 57° C. | $5 \times 10^4$ (Pa) | Δ |
| Ex.2 | C22A/C1A/AA 45/50/5 | 54° C. | $1 \times 10^5$ (Pa) | ○ |
| Ex.3 | C22A/C1A/AA 35/60/5 | 46° C. | $1 \times 10^6$ (Pa) | ○ |
| Comp Ex.1 | C22A/C1A/AA 65/30/5 | 60° C. | $1 \times 10^4$ (Pa) | X |
| Comp Ex.2 | C18A/C16A/AA 92/5/3 | 50° C. | $1 \times 10^3$ (Pa) | X |
| Comp Ex.3 | Product by another company | — | $5 \times 10^4$ (Pa) | Δ |

*The modulus of elasticity is a value taken at 80° C.
X: unacceptable products
Δ: acceptable products
○: excellent products In Table 2, C22A represents dococyl acrylate; C1A represents methyl acrylate; AA represents acrylic acid; C18 represents stearyl acrylate; and C16 represents hexadecyl acrylate.

INDUSTRIAL APPLICABILITY

There is provided an adhesive tape for temporary attachment of green sheets for ceramic electronic devices, and a method for producing ceramic electronic devices, such that a sufficient adhesion strength is exhibited until a step of cutting the green sheets is performed and that a reduction in the adhesion strength is realized when peeling of f the works so that interlayer destruction does not occur and no residues are left.

There is provided an adhesive tape for temporary attachment of green sheets for ceramic electronic devices having an adhesive layer which can reduce the stress which is generated at the time of insertion of a cutting blade (tendency of green sheets to move in a lateral direction responsive to the insertion of the blade) and improve the deviation in the positions of electrodes within the chips after the cutting, and a method for producing ceramic electronic devices.

What is claimed is:

1. An adhesive tape for temporary attachment of green sheets for a ceramic electronic device, comprising a substrate film and an adhesive layer provided on at least one face of the substrate film, the adhesive layer comprising an adhesive composition, the adhesive composition containing a side-chain crystallizable polymer, wherein the side-chain crystallizable polymer comprises as a component an acrylic acid alkyl ester and/or a methacrylic acid alkyl ester which has a straight-chain alkyl group including 16 or more carbon atoms as a side chain, the side-chain crystallizable polymer having a first-order melting transition occurring in a temperature range narrower than about 35° C., wherein the adhesive layer has a modulus of elasticity of about $5 \times 10^4$ Pa to about $1 \times 10^8$ Pa, so that the lateral deformation stress, which is applied owing to the thickness of a cutting blade as it is inserted, can be reduced by the elastic properties of the adhesive layer.

2. An adhesive tape for temporary attachment according to claim 1, wherein the side-chain crystallizable polymer is obtained from a monomer mixture comprising: about 40 to about 70 wt. % of an acrylic acid alkyl ester and/or a methacrylic acid alkyl ester which has an alkyl group including 1 to 6 carbon atoms: about 2 to about 10 wt. % of a carboxyl group-containing ethylenic unsaturated monomer; and about 20 to about 60 wt. % of an acrylic acid alkyl ester and/or a methacrylic acid alkyl ester which has an alkyl group including 16 to 22 carbon atoms.

3. A method for producing a ceramic electronic device, comprising the steps of:

allowing a green sheet laminate of ceramics to adhere to a base via an adhesive tape, and thereafter cutting the laminate into chips; and peeling the chips off a surface of the base while cooling the adhesive tape, wherein the adhesive tape comprises a substrate film and an adhesive layer provided on at least one face of the substrate film, the adhesive layer comprising an adhesive composition, the adhesive composition containing a side-chain crystallizable polymer, wherein the side-chain crystallizable polymer comprises as a component an acrylic acid ester and/or a methacrylic acid ester which has a straight-chain alkyl group including 16 or more carbon atoms as a side chain, the side-chain crystallizable polymer having a first-order melting transition occurring in a temperature range narrower than about 35° C., wherein the adhesive layer has a modulus of elasticity of about $5 \times 10^4$ Pa to about $1 \times 10^8$ Pa, so that the lateral deformation stress, which is applied owing to the thickness of a cutting blade as it is inserted, can be reduced by the elastic properties of the adhesive layer.

4. A method for producing a ceramic electronic device according to claim 3, wherein the ceramic electronic device is a ceramic capacitor.

* * * * *